(12) United States Patent
Yoshida et al.

(10) Patent No.: US 10,147,722 B2
(45) Date of Patent: Dec. 4, 2018

(54) ISOLATED CIRCUIT FORMED DURING BACK END OF LINE PROCESS

(71) Applicant: Renesas Electronics America Inc., Santa Clara, CA (US)

(72) Inventors: Kenji Yoshida, Cupertino, CA (US); Tetsuo Sato, San Jose, CA (US); Shigeru Maeta, San Jose, CA (US); Toshio Kimura, Cupertino, CA (US)

(73) Assignee: RENESAS ELECTRONICS AMERICA INC., Santa Clara, CA (US)

(*) Notice: Subject to any disclaimer, the term of this patent is extended or adjusted under 35 U.S.C. 154(b) by 0 days.

(21) Appl. No.: 15/235,878

(22) Filed: Aug. 12, 2016

(65) Prior Publication Data

US 2018/0047756 A1   Feb. 15, 2018

(51) Int. Cl.

| | | |
|---|---|---|
| H01L 27/06 | (2006.01) | |
| H01L 25/065 | (2006.01) | |
| H01L 27/12 | (2006.01) | |
| H01L 29/786 | (2006.01) | |
| H01L 23/538 | (2006.01) | |
| H03K 7/08 | (2006.01) | |
| H01L 23/528 | (2006.01) | |

(52) U.S. Cl.
CPC ........ *H01L 27/0688* (2013.01); *H01L 23/528* (2013.01); *H01L 23/5386* (2013.01); *H01L 25/0657* (2013.01); *H01L 27/1218* (2013.01); *H01L 27/1225* (2013.01); *H01L 29/7869* (2013.01); *H01L 29/78603* (2013.01); *H03K 7/08* (2013.01)

(58) Field of Classification Search
CPC ............. H01L 27/1218; H01L 23/5386; H01L 29/78603
See application file for complete search history.

(56) References Cited

U.S. PATENT DOCUMENTS

| | | | |
|---|---|---|---|
| 9,553,202 B2 * | 1/2017 | Kurata | H01L 27/1225 |
| 2003/0090338 A1 * | 5/2003 | Muramatsu | H03H 7/0115 |
| | | | 333/133 |
| 2003/0178947 A1 * | 9/2003 | Shin | G09G 3/3266 |
| | | | 315/169.3 |
| 2007/0215906 A1 * | 9/2007 | Wu | H01L 21/8221 |
| | | | 257/204 |
| 2009/0294822 A1 * | 12/2009 | Batude | H01L 27/11 |
| | | | 257/314 |
| 2010/0148171 A1 * | 6/2010 | Hayashi | H01L 21/28282 |
| | | | 257/43 |

(Continued)

*Primary Examiner* — Andres Munoz
(74) *Attorney, Agent, or Firm* — Foley & Lardner LLP

(57) ABSTRACT

A semiconductor die is disclosed upon which is formed direct current (DC) isolated first and second circuits. The first circuit is configured for electrical connection to a first ground. The second circuit is configured for electrical connection to a second ground. The first and second grounds can be at different potentials. The first and second circuits were formed using front end of line (FEOL) and back end of line (BEOL) processes. The first circuit includes a plurality of first devices, such as transistors, which were formed during the FEOL process, and the second circuit includes only second devices, such as transistors, which were formed during the BEOL process.

19 Claims, 4 Drawing Sheets

(56) References Cited

U.S. PATENT DOCUMENTS

| | | | |
|---|---|---|---|
| 2010/0314710 A1* | 12/2010 | Yamaji | H01L 24/05 257/501 |
| 2011/0084765 A1* | 4/2011 | Kim | H01F 17/0013 330/277 |
| 2011/0089417 A1* | 4/2011 | Yamazaki | H01L 27/0688 257/43 |
| 2011/0101334 A1* | 5/2011 | Yamazaki | G11C 11/404 257/43 |
| 2011/0101339 A1* | 5/2011 | Yamazaki | G11C 11/405 257/43 |
| 2011/0101351 A1* | 5/2011 | Yamazaki | G11C 11/405 257/57 |
| 2011/0227158 A1* | 9/2011 | Zhu | H01L 23/481 257/347 |
| 2011/0316118 A1* | 12/2011 | Uchida | H01L 23/5227 257/531 |
| 2012/0001243 A1* | 1/2012 | Kato | H01L 27/0688 257/296 |
| 2012/0292777 A1* | 11/2012 | Lotz | H01L 23/481 257/774 |
| 2013/0037965 A1* | 2/2013 | Morimoto | H01L 23/5286 257/774 |
| 2013/0287141 A1* | 10/2013 | Kaeriyama | H04L 1/0041 375/296 |
| 2015/0255490 A1* | 9/2015 | Miyairi | H01L 27/1207 257/43 |
| 2015/0348961 A1* | 12/2015 | Isobe | H01L 27/0266 361/56 |

* cited by examiner

ISOLATED CIRCUIT FORMED DURING BACK END OF LINE PROCESS

BACKGROUND

A circuit is composed of individual devices, such as resistors, transistors, capacitors, diodes, etc., interconnected by metal conductors (e.g., wiring) through which electric current can flow. The combination of devices and wiring allows various simple and complex operations to be performed: voltages can be converted, signals can be amplified, computations can be performed, data can be moved from one place to another, etc. Integrated circuits are circuits that are fabricated on a wafer made of a semiconducting material. Silicon is the typical semiconducting material used in wafers. Once fabrication is complete, the wafer is cut into many pieces (i.e., dies), with each die containing a copy of the integrated circuit.

Integrated circuit (IC) fabrication includes two process portions: a front-end-of-line (FEOL) portion followed by back-end-of-line (BEOL) portion. Individual devices (e.g., transistors, capacitors, diodes, etc.) are formed in the semiconductor wafer during FEOL. FEOL involves several sequential steps including masking, etching, doping, etc., and others well known in the art. FEOL generally covers everything up to (but not including) the creation of metal interconnect layers.

BEOL is the second portion of IC fabrication where devices formed during FEOL are interconnected with metal wiring to create a circuit. BEOL generally begins when the first layer of metal is deposited on the wafer. BEOL includes the formation of contacts or vias, insulating layers (e.g., dielectrics), metal wiring, and bonding sites. Ten or more metal interconnect layers, each having vias, insulating layers, metal wiring, etc., can be added during BEOL. The top-most metal interconnect layers usually have the thickest, widest and most widely-separated metal wiring, which make them very well suited for power or ground distribution since they have the least resistance.

SUMMARY

A semiconductor die that contains direct current (DC) isolated first and second circuits. The first circuit is configured for electrical connection to a first ground. The second circuit is configured for electrical connection to a second ground. The first and second grounds can be at different potentials. The first and second circuits were formed using front end of line (FEOL) and back end of line (BEOL) processes. The first circuit includes a plurality of first devices, such as transistors, which were formed during the FEOL process, and the second circuit includes only plurality of second devices, such as transistors, which were formed during the BEOL process. In one embodiment, the first circuit may also include devices that were formed during the BEOL process portion of manufacturing the semiconductor die.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

BEOL need not be limited to merely interconnecting FEOL devices to create an IC on a semiconductor die. Additional devices (e.g., transistors, diodes, capacitors, resistors, etc.) can be fabricated in the metal interconnect layers during BEOL. These BEOL formed devices can be interconnected to form a circuit. U.S. Pat. No. 9,082,643, and Kaneko, K. et. al., "A Novel BEOL-Transistor (BETr) with InGaZnO Embedded in Cu-Interconnects for On-chip High Voltage I/Os in Standard CMOS LSIs", 2011 Symposium on VLSI Technology Digest of Technical Papers, pp. 120-121 (2011), both of which are incorporated herein by reference, describe example devices such as thin film transistors (TFTs) that can be formed in metal interconnect layers during BEOL.

Figure 1:
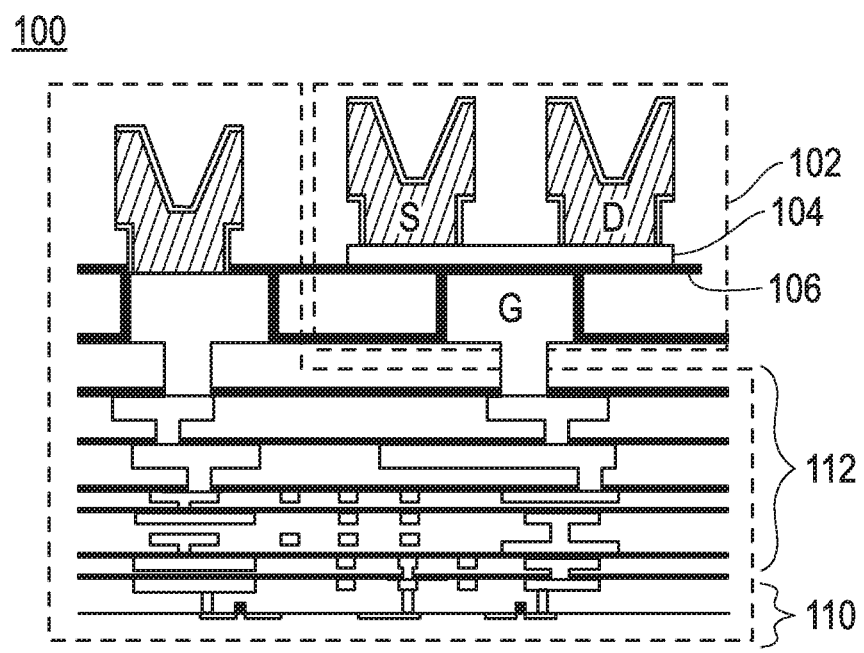
FIG. 1 illustrates a cross sectional view of an example IC formed on a die.

FIG. 1 illustrates a cross sectional view of an example IC 100 fabricated on die. A die in the context of ICs is a small block of semiconducting material such as silicon, on which a given functional circuit is fabricated. FIG. 1 shows a TFT 102 that was formed during BEOL fabrication of IC 100. TFT 102 includes a thin layer 104 of InGaZnO or other semiconductor material, an insulating layer 106 that separates the InGaZnO layer from a copper gate G, an aluminum source S and an aluminum drain D. FIG. 1 also shows a layer 110 of devices (e.g., transistors) that were formed on the die during FEOL. The devices in layer 110 are separated from TFT 102 by several metal interconnect layers 112. One or more of the metal interconnect layers 112 include metal wiring and contacts that couple devices in layer 110 to create a circuit.

In some cases, gate G is coupled to one or more BEOL devices in layer 110 in FIG. 1 via contacts and metal wiring in interconnect layers 112. BEOL devices like TFT 102 need not be connected to FEOL devices; a circuit of interconnected BEOL formed devices on a die can be DC isolated from a circuit of interconnected FEOL devices on the same die. DC isolation eliminates a DC path between circuits. The same cannot be said for two circuits of FEOL formed devices on a die. Two circuits of FEOL devices formed on a die share a common silicon substrate, and as a result the two circuits cannot be electrically isolated from each other. In other words, the two circuits are electrically connected to each other through the common silicon substrate.

Many electrical systems require DC isolation between their circuits for any one of several reasons. AC/DC converters, isolated DC/DC converters, DC/AC converters, AC/AC converters, etc., are examples of electrical systems that require DC isolation between circuits thereof. DC isolation protects people from shocks that could otherwise occur when circuits of the converter are connected to grounds at different potentials. "Ground" is a term used to describe a common return path for electric current in a circuit. Transformers, opto-couplers, etc., are example components that can be employed to isolate individual circuits in converters so that no DC path exists therebetween. The present invention will be described with reference to an AC/DC convertor, it being understood the present invention should not be limited thereto.

Figure 2:
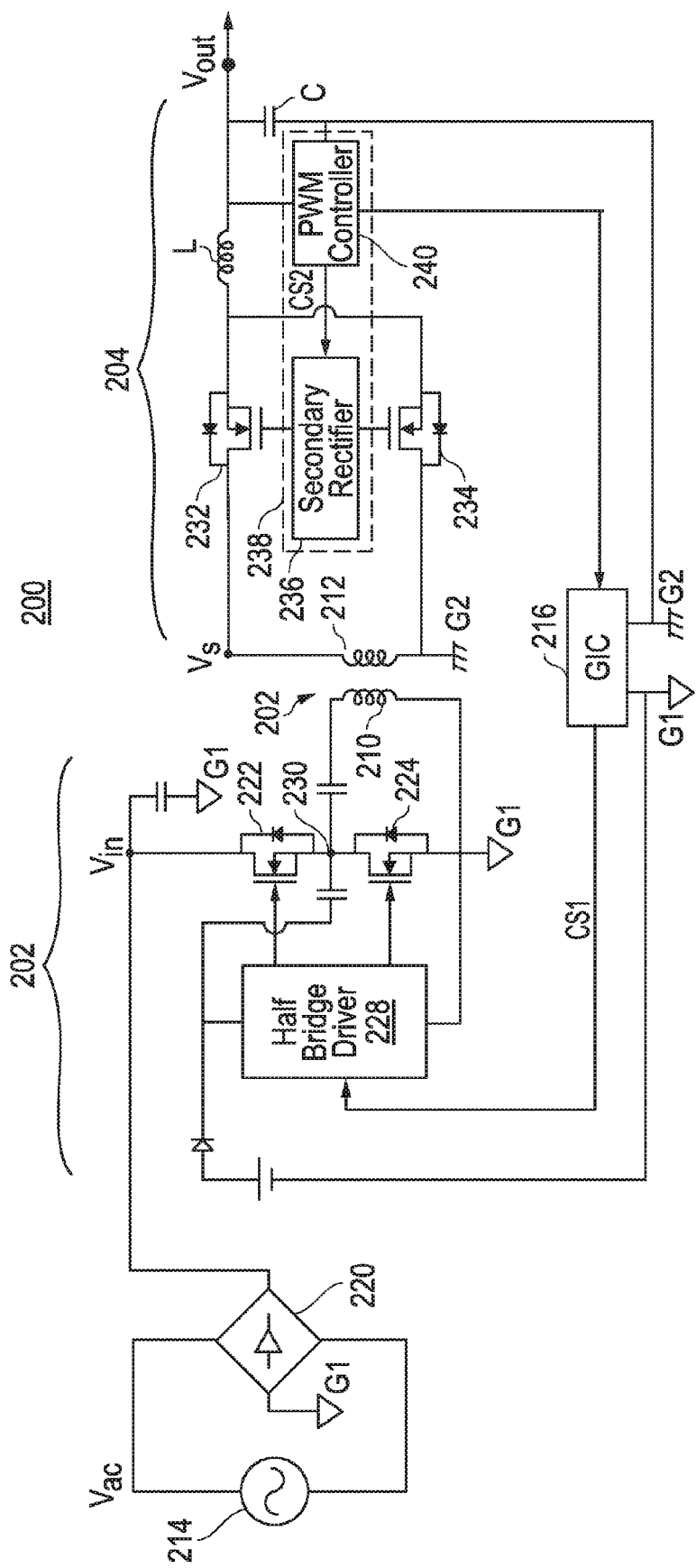
FIG. 2 is a schematic diagram illustrating an example AC/DC converter.

FIG. 2 illustrates relevant components of an example AC/DC converter 200 that employs a transformer 201 coupled between a primary side circuit 202 and a secondary side circuit 204. Although not shown, the foregoing components are mounted on a printed circuit board (PCB). Transformer 201 includes a primary winding 210 and a secondary winding 212. The primary winding 210 and primary side circuit 202 are coupled to ground G1, while the secondary winding 212 and secondary side circuit 204 are coupled to ground G2. Ground G1 is presumed herein to be at a different potential or voltage than ground G2. Transformer 201 provides DC isolation between primary side circuit 202 and secondary side circuit 204. A galvanic isolation circuit (GIC) 216 is also mounted to the PCB and coupled between primary side circuit 202 and secondary side circuit 204. GIC 216 provides DC isolation between primary side circuit 202 and secondary side circuit 204, while enabling data communication therebetween. As shown in FIG. 2 GIC 216 is coupled to both grounds G1 and G2.

Primary side circuit 202 is coupled to an alternating current (AC) power supply 214 through a diode rectifier 220. Diode rectifier 220 rectifies the AC voltage of power supply 214 to generate Vin. Primary side circuit 202 is provided with Vin, which is a continuous, but poorly regulated intermediate DC voltage. The secondary side circuit 204 generates a DC output voltage Vout from Vs, a voltage induced across the secondary winding 212. Vout powers a device (e.g., a microprocessor not shown). In the embodiment shown, secondary circuit 204 generates and transmits a control signal CS1 (e.g., a pulse width modulation (PWM) signal) to primary side circuit 202 via GIC 216. Control signal CS1 affects the magnitude of the induced voltage Vs, and thus Vout.

Primary side circuit 202 includes high-side and low-side power transistors 222 and 224, respectively, coupled as shown between Vin and ground G1. These power transistors can be formed on the same or separate dies. Primary circuit 202 also includes a half-bridge driver 228 that controls transistors 222 and 224. Half-bridge driver 228 takes form in a circuit created from FEOL devices on a die. Secondary side circuit 212 includes power transistors 232 and 234 that are coupled between Vs and G2 as shown. These power transistors can be formed on the same or separate dies. Secondary circuit 212 also includes a secondary rectifier 236 and a PWM controller 240 formed on a die 238. The secondary rectifier 236 and PWM controller 240 are each created from interconnected FEOL devices on die 238, which is different from the die that contains half-bridge driver 228. The die that contains half bridge driver 228, and the die 238 that contains secondary rectifier 236 and a PWM controller 240, are both mounted on the same PCB, but coupled to different ground planes thereof. A ground plane on a PCB is an electrically conductive surface, usually connected to electrical ground. PWM controller 240 generates control signals CS1 and CS2 for controlling half-bridge driver 228 and secondary rectifier 236, respectively. PWM controller 240 generates CS1 and/or CS2 as a function of Vout. In one embodiment, PWM controller 240 adjusts CS1 and/or CS2 in order to maintain Vout at a designated voltage level.

As noted above, half-bridge driver 228 controls transistors 222 and 224. Half-bridge driver 228 in turn is controlled by control signal CS1, which is generated by PWM controller 240 and received by half-bridge driver 228 via GIC 216. Thus, PWM controller 240 indirectly controls transistors 222 and 224 via control signal CS1. Half-bridge driver 228 is coupled to ground G1, while PWM controller 240 is coupled to ground G2. Because half-bridge driver 228 and PWM controller 240 are coupled to grounds of different potential, half-bridge driver 228 and a PWM controller 240 must be DC isolated from each other. GIC 216 DC isolates PWM controller 240 and half-bridge driver 228, while transmitting control signal CS1 therebetween.

In one embodiment, half-bridge driver 228 generates complimentary, non-overlapping high-side and low-side PWM signals that drive the gates of high-side and low-side transistors 222 and 224, respectively. High-side transistor 222 transmits current to common node 230 with each pulse of the high-side PWM signal, and low-side transistor 224 transmits current from ground G1 to common node 230 with each pulse of the low-side PWM signal. Since the high-side and low-side PWM signals are complementary and non-overlapping, only one of the transistors 222 and 224 is activated and transmitting current at any given time. The high-side PWM signal controlling transistor 222 has a pulse width of T1 while the low-side PWM signal controlling transistor 224 has a pulse width of T2. T1 and T2 depends on control signal CS1. Thus, PWM controller 240 controls the pulse widths of the high-side and low-side PWM signals through the control signal CS1 it generates.

Current flow through primary winding 210 induces a voltage Vs across secondary winding 212. The gates of transistors 232 and 234 transistors are controlled by secondary rectifier 238, which in turn is controlled by control signal CS2. Thus, PWM controller 240 indirectly controls transistors 232 and 234 via the control signal CS2 it generates. PWM controller 240 monitors output voltage Vout. PWM controller 240 generates CS1 and/or CS2 as a function of Vout. For example, if the magnitude of Vout varies from a reference value provided to PWM controller 240, PWM controller 240 can adjust control signals CS1 and/or CS2, which in turn modifies Vout so that its magnitude conforms to the reference value.

The cost of manufacturing converter 200 depends on many variables including the size of the PCB and the number of ICs (e.g., half-bridge driver 228) mounted thereon. Half-bridge driver 228, secondary rectifier 236, and PWM controller 240 are circuits created from FEOL formed devices on separate dies as noted above. The cost of manufacturing converter 200 could be reduced if all three of these circuits can be created on the same die. However, half-bridge driver 228 is coupled to ground G1, while the combination of secondary rectifier 236 and PWM controller 240 is coupled to ground G2, which is at a different potential. ICs in AC/DC converters that are coupled to different grounds, must be DC isolated from each other to prevent electric shock to users. The DC isolation requirement precludes use of a single die that contains half-bridge driver 228, PWM controller 240, and secondary rectifier 236 when they are all created from devices that share the same semiconductor substrate. In other words, any attempt to create half-bridge driver 228, secondary rectifier 238, and PWM controller 240 from FEOL devices on the same silicon substrate, may present a safety risk.

Figure 3:
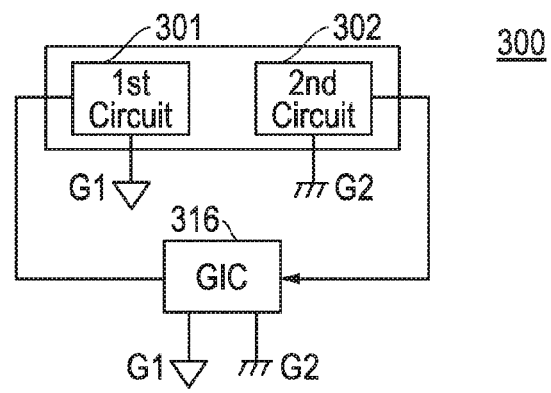
FIG. 3 is a block diagram illustrating an example IC that employs one embodiment of the present invention.

FIG. 3 illustrates one embodiment of an IC 300 formed on a single die that addresses the foregoing problems and others. IC 300 contains a pair of circuits 301 and 302. In the embodiment shown, first circuit 301 is coupled to ground G1, while second circuit 302 is coupled to ground G2 of different potential. In one embodiment, the die that contains IC 300 may be mounted on a PCB, which contains separate ground planes, one of which is coupled to a ground conductor of the first circuit 301, while the other is coupled to a ground conductor of the second circuit 302. In one embodiment, devices (e.g., transistors, diodes, resistors, etc.) of the second circuit 302 are formed during the FEOL portion of IC 300 fabrication, while devices (e.g., transistors, diodes, resistors, etc.) of the first circuit 301 are formed during the BEOL portion of IC 300 fabrication. Devices of the first circuit 301 are coupled together via metal wiring formed during BEOL, and devices of the second circuit 302 are also coupled together via metal wiring formed during BEOL. Circuits 301 and 302 are DC isolated from each other so that no DC path exists therebetween. More particularly, one or more insulation layers (not shown in FIG. 3) created during BEOL, isolate circuits 301 and 302 from each other. Second circuit 302 can communicate with the first circuit 301 via the GIC shown.

Figure 4:
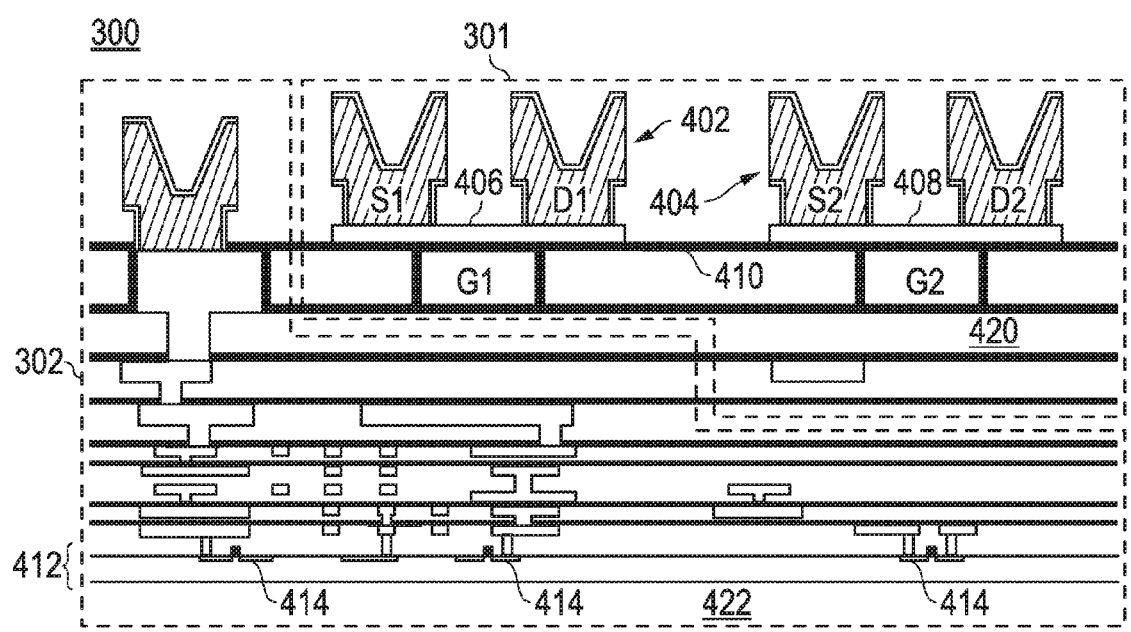
FIG. 4 is a cross sectional view of an example IC formed on a die in accordance with one embodiment of the present invention.

FIG. 4 illustrates a cross sectional view of an example IC 300. FIG. 4 shows only a portion of the example IC 300. In the illustrated embodiment, IC 300 includes TFT 402 and TFT 404 of the first circuit 301, which was formed during BEOL. TFTs 402 and 404 include thin layers 406 and 408, respectively, of InGaZnO or other semiconductor material. In one embodiment, TFTs 402 and 404 may take form in N-type and P-type transistors, respectively, or vice versa, which are formed with InGaZnO and SnO semiconductor layers, respectively. In another embodiment, TFTs 402 and 404 take form in N-type transistors, or TFTs 402 and 404 take form in P-type transistors. An insulating layer 410 separates the InGaZnO layers from copper gates G1 and G2, aluminum sources S1 and S2, and aluminum drains D1 and D2. In one embodiment, gates G1 and G2 may be interconnected to each other via a metal wiring (not shown) to create, for example, a complementary metal-oxide-semiconductor (CMOS) device. FIG. 4 also shows a layer 412 of FEOL devices including transistors 414 that share silicon substrate 422. The devices in layer 412 are interconnected to form the second circuit 302. Source S1 may be coupled to ground G1, while devices in layer 412 are coupled to ground G2. The second circuit 302 is electrically isolated from TFTs 402 and 404 and other devices of the first circuit by at least one insulating layer, such as insulating layer 420. As such, no DC current can flow between first and second circuits 301 and 302.

Figure 5:
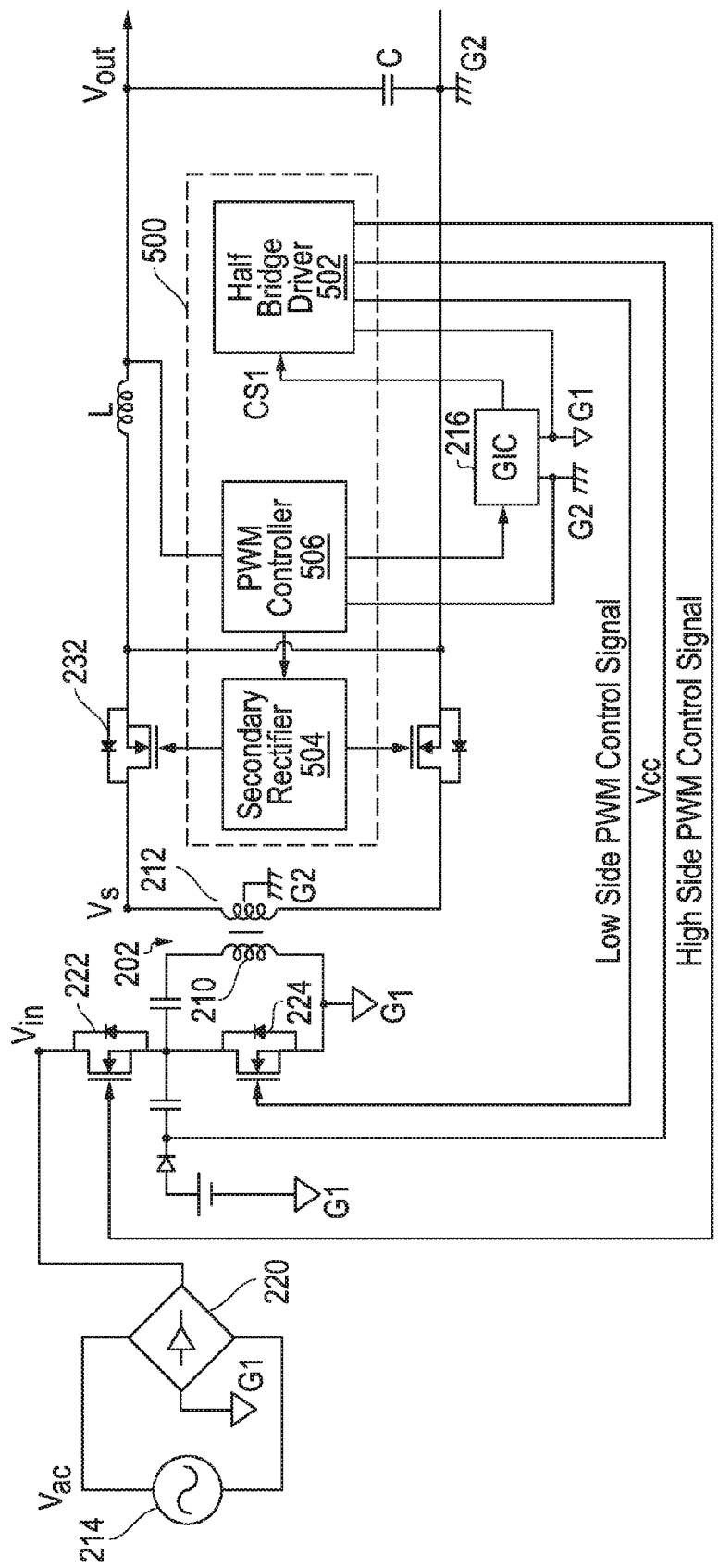
FIG. 5 is a schematic diagram illustrating an example AC/DC converter that employs one embodiment of the present invention.

FIG. 5 illustrates the AC/DC converter shown in FIG. 2 with half-bridge driver 228, secondary rectifier 236 and PWM controller 240 replaced with a single die containing IC 500. IC 500 is fabricated using FEOL and BEOL processes. In this embodiment, IC 500 includes a half-bridge driver 502, which is formed from interconnected devices created during BEOL. IC 500 also includes secondary rectifier 504 and PWM controller 506, both of which are formed from interconnected devices created during FEOL. Half-bridge driver 502 functions in substantially the same manner as half-bridge driver 228. A secondary rectifier 504 and PWM controller 506 function in substantially the same manner as secondary rectifier 238 and PWM controller 240, respectively Importantly, both secondary rectifier 504 and PWM controller 506 are connected to ground G2, while half-bridge driver 502 is connected to ground G1. Although not shown within FIG. 5, an insulation layer is physically separating half-bridge driver 502 and the combination of secondary rectifier 504 and PWM controller 506, to eliminate a DC path between driver 502 on one hand and the combination of rectifier 504 and PWM controller 506 on the other hand. Since the three circuits are formed on a single die, the cost of manufacturing the AC/DC converter shown in FIG. 5 is less than the cost of manufacturing the AD/DC convertor shown in FIG. 2. Further, PCB space needed by the die that contains IC 500 will be less than the PCB space needed by the dies needed for half-bridge driver 228, secondary rectifier 236 and PWM controller 240.

Figure 6:
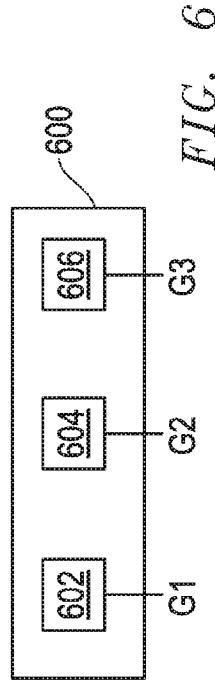
FIG. 6 is a block diagram illustrating an example IC that employs one embodiment of the present invention.

FIG. 6 illustrates a block diagram of an IC 600 formed on a single. IC 600 contains a three electrically isolated circuits 602-606. In the embodiment shown, first circuit 602 is coupled to ground G1, second circuit 604 is coupled to ground G2, while third circuit 606 is coupled to ground G3. In one embodiment, devices (e.g., transistors, diodes, resistors, etc.) of the first circuit 602 are formed during the FEOL portion of IC 600 fabrication, while devices (e.g., transistors, diodes, resistors, etc.) of the second and third circuits 604 and 606, respectively are formed during the BEOL portion of IC 600 fabrication. Devices of the first circuit 602 are coupled together via metal wiring formed during BEOL, devices of the second circuit 604 are also coupled together via metal wiring formed during BEOL, and devices of the third circuit 606 are also coupled together via metal wiring formed during BEOL. Circuits 602-606 are DC isolated from each other so that no DC path exists therebetween. More particularly, one or more insulation layers (not shown in FIG. 3) created during BEOL, isolate circuits 602-606 from each other.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. An apparatus comprising:
   a semiconductor die including a semiconductor wafer; and
   direct current (DC) isolated first and second circuits commonly formed on the semiconductor die;
   wherein the first circuit is configured for electrical connection to a first ground that is external to the semiconductor die;
   wherein the second circuit is configured for electrical connection to a second ground that is external to the semiconductor die;
   wherein the first circuit comprises a plurality of first devices that were formed during a front end of line (FEOL) portion of a process for manufacturing the semiconductor die, the plurality of first devices including at least one device formed in the semiconductor wafer, and;
   wherein the second circuit comprises a plurality of second devices that were formed during a back end of line (BEOL) portion of the process of manufacturing the semiconductor die;
   wherein the second circuit does not include any devices formed in the semiconductor wafer.

2. The apparatus of claim 1 wherein an electrical isolation layer is formed between the first and second circuits, and wherein the electrical isolation layer is formed during the BEOL process.

3. The apparatus of claim 2 wherein the plurality of second devices comprises a first thin film transistor (TFT).

4. The apparatus of claim 1 wherein the first circuit comprises a circuit for generating a control signal for controlling the second circuit.

5. The apparatus of claim 4 further comprising a galvanic isolation device that is external to the semiconductor die, wherein the galvanic isolation device is between and in data communication with the first and second circuits.

6. The apparatus of claim 4 further comprising a device that is external to the semiconductor die, wherein the device is configured to transmit alternating current (AC) components of the control signal, but not a direct current (DC) component of the control signal, from the first circuit to the second circuit.

7. The apparatus of claim 1 further comprising:
first and second transistors, which are external to the semiconductor die, coupled in series between a voltage input and the first ground;
wherein the second circuit is configured to generate first and second control signals for controlling the first and second transistors, respectively, in response to a control signal generated by the first circuit.

8. The apparatus of claim 1 wherein the first circuit comprises at least one TFT, which was formed during the BEOL portion of the process for manufacturing the semiconductor die.

9. An apparatus comprising:
direct current (DC) isolated first and second circuits formed on a semiconductor die;
wherein the first circuit is configured for electrical connection to a first ground that is external to the semiconductor die;
wherein the second circuit is configured for electrical connection to a second ground that is external to the semiconductor die;
wherein the first circuit comprises a plurality of first devices that were formed during a front end of line (FEOL) portion of a process for manufacturing the semiconductor die, and;
wherein the second circuit comprises a plurality of second devices that were formed during a back end of line (BEOL) portion of the process of manufacturing the semiconductor die;
wherein the second circuit does not include devices that were formed during the FEOL portion of the process for manufacturing the semiconductor die; and
a third circuit formed on the semiconductor die;
wherein the third circuit is DC isolated from the first and second circuits;
wherein the third circuit comprises a third conductor that is configured for electrical connection to a third ground that is external to the semiconductor die;
wherein the third circuit comprises a plurality of third devices that are formed during the BEOL process.

10. An apparatus comprising
electrically isolated first and second circuits both commonly formed on a semiconductor die;
wherein the first circuit comprises a first conductor that is configured for electrical connection to a first ground that is external to the semiconductor die;
wherein the second circuit comprises a second conductor that is configured for electrical connection to a second ground that is external to the semiconductor die;
wherein the first circuit comprises first transistors formed in a semiconductor substrate of the semiconductor die, and;
wherein the second circuit does not include any transistors that are formed in the semiconductor substrate.

11. The apparatus of claim 10 wherein the first transistors are formed during a front end of line (FEOL) process, and wherein second transistors of the second circuit are formed during a back end of line (BEOL) process.

12. The apparatus of claim 11 wherein an electrical isolation layer is formed between the first and second circuits, and wherein the electrical isolation layer is formed during the BEOL process.

13. The apparatus of claim 11 wherein the second transistors comprises a first thin film transistor (TFT).

14. The apparatus of claim 10 wherein the first circuit comprises a circuit for generating a control signal for controlling the second circuit.

15. The apparatus of claim 14 further comprising a device that is formed on another semiconductor die, wherein the device is configured to transmit alternating current (AC) components of the control signal, but not a direct current (DC) component of the control signal, from the first circuit to the second circuit.

16. The apparatus of claim 10 further comprising a galvanic isolation device that is not formed on the semiconductor die, wherein the first and second circuits are in data communication with each other via the galvanic isolation device.

17. The apparatus of claim 10 further comprising:
first and second power transistors, which are formed on second and third dies, respectively, coupled in series between a voltage input and the first ground;
wherein the second circuit is configured to generate first and second control signals for controlling the first and second power transistors, respectively, in response to a control signal generated by the first circuit.

18. The apparatus of claim 10 further comprising:
a third circuit formed on the semiconductor die;
wherein the third circuit is DC isolated from the first and second circuits;
wherein the third circuit is configured for electrical connection to a third ground that is external to the semiconductor die.

19. The apparatus of claim 18 wherein the third circuit comprises third transistors that are not formed in the semiconductor substrate.

* * * * *